(12) United States Patent
Tronconi et al.

(10) Patent No.: US 7,783,449 B2
(45) Date of Patent: Aug. 24, 2010

(54) DIGITAL HIGH-PASS FILTER FOR A DISPLACEMENT DETECTION DEVICE OF A PORTABLE APPARATUS

(75) Inventors: Michele Tronconi, San Martino Siccomario (IT); Enrico Chiesa, Besozzo (IT); Fabio Pasolini, San Martino Siccomario (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 312 days.

(21) Appl. No.: 11/864,447

(22) Filed: Sep. 28, 2007

(65) Prior Publication Data
US 2008/0079594 A1 Apr. 3, 2008

Related U.S. Application Data

(63) Continuation of application No. PCT/EP2006/061116, filed on Mar. 28, 2006.

(30) Foreign Application Priority Data
Mar. 31, 2005 (EP) .................... 05425184

(51) Int. Cl.
*G01P 15/00* (2006.01)
(52) U.S. Cl. .................. 702/141; 702/150; 702/94; 708/300
(58) Field of Classification Search ............ 702/94–96, 702/141, 142, 150–154; 396/53; 340/669; 708/300, 303, 322
See application file for complete search history.

(56) References Cited

U.S. PATENT DOCUMENTS

| | | | | |
|---|---|---|---|---|
| 5,155,520 A | * | 10/1992 | Nagasaki et al. | 396/53 |
| 5,590,065 A | * | 12/1996 | Lin | 708/313 |
| 5,659,316 A | * | 8/1997 | Stierli | 341/143 |
| 5,777,909 A | * | 7/1998 | Leung et al. | 708/300 |
| 6,128,442 A | | 10/2000 | Enomoto | |
| 2006/0213267 A1 | | 9/2006 | Tronconi et al. | |

OTHER PUBLICATIONS

D. Ausilio et al., "A low-g 3 axis accelerometer for emerging automotive applications," AMAA 2004, 12 pages.
C. Dick et al., "FPGA Signal Processing Using Sigma-Delta Modulation," IEEE Signal Processing Magazine, Jan. 2000, pp. 20-35.
R. Lyons, "Understanding Digital Signal Processing," Prentice Hall, 2004, pp. 553-555.

* cited by examiner

*Primary Examiner*—Manuel L Barbee
(74) *Attorney, Agent, or Firm*—Lisa K. Jorgenson; Robert Iannucci; Seed IP Law Group PLLC

(57) ABSTRACT

A digital high-pass filter has an input, an output, and a subtractor stage, having a first input terminal, a second input terminal and an output terminal. The first input terminal of the subtractor stage is connected to the input of the digital high-pass filter and the output terminal is connected to the output of the digital high-pass filter. A recursive circuit branch is connected between the output of the digital high-pass filter and the second input terminal of the subtractor stage. Within the recursive circuit branch are cascaded an accumulation stage, constituted by an integrator circuit, and a divider stage. The cutoff frequency of the digital high-pass filter is variable according to a dividing factor of the divider stage.

25 Claims, 3 Drawing Sheets

DIGITAL HIGH-PASS FILTER FOR A DISPLACEMENT DETECTION DEVICE OF A PORTABLE APPARATUS

CROSS-REFERENCE TO RELATED APPLICATION

This application is a continuation of International Application No. PCT/EP2006/061116, filed Mar. 28, 2006, and claims priority from European Patent Application No. 05425184.8, filed Mar. 31, 2005, which applications are incorporated herein by reference in their entirety.

BACKGROUND

1. Technical Field

The present invention relates to a digital high-pass filter, in particular for use in a displacement detection device for detecting displacements of a portable apparatus, to which the following description will make explicit reference, without this implying any loss of generality.

2. Description of the Related Art

As is known, in the last few years, with the increasing use of portable apparatuses (such as laptops, PDAs—Personal Data Assistants, digital audio players, mobile phones, digital cameras, and the like), a need has grown for simplifying the use of said apparatuses and in particular their user interface. In this regard, of particular interest has proven the possibility of activating given functions or programs in the portable apparatuses with a simple movement made by the user. Consider, for example, navigation within a list of options or the phone book of a mobile phone by simply tilting it or moving it in the direction in which the list or the phone book is to be scrolled, or the possibility of adapting the display of an image on a PDA by simply modifying its inclination.

In some portable apparatuses, the introduction of displacement detection devices has thus been proposed which enable the activation of functions or programs following upon the detection of a movement imparted by the user.

The displacement detection devices of a known type generally comprise acceleration sensors, which detect the acceleration acting on the corresponding portable apparatus along one or more detection directions, and generate corresponding electrical signals. An appropriate processing circuit connected to the acceleration sensors processes the acceleration signals thus generated, and in particular compares them with pre-set acceleration thresholds. In particular, exceeding of one of the acceleration thresholds indicates that the portable apparatus has undergone a displacement in a corresponding direction.

However, due to the acceleration of gravity, the acceleration sensors have a non-zero output also in the absence of an acceleration exerted on the portable apparatus by the user. Furthermore, the acceleration signals generated on account of the sole acceleration of gravity have different values according to the resting position of the portable apparatus, in so far as the components of the acceleration of gravity along the detection directions are each time different. Consequently, the exceeding of the acceleration thresholds by the acceleration signals, in the presence of an acceleration exerted on the portable apparatus, is dependent upon the initial position (and in particular upon the orientation) of the portable apparatus. This leads to disparity of operation according to the initial resting position of the portable apparatus chosen by the user, a position that varies, for example, between right-handed users and left-handed users, and in any case according to the preference of the various users.

To solve the above problem, in the Italian patent application No. TO2004A000847, filed in the name of the present applicant on Dec. 1, 2004, the use of a high-pass filter was proposed, said high-pass filter being arranged between the acceleration sensors and the corresponding processing circuit. The high-pass filter eliminates the continuous component of the acceleration signals linked to the acceleration of gravity so as to render the displacement detection independent of the initial position of the portable apparatus.

As is known, numerical high-pass filters are generally made with FIR (Finite Impulse Response) or IIR (Infinite Impulse Response) structures. In order to effectively reduce the continuous component of the acceleration signals, without, however, altering the frequency components indicative of the displacements to be detected (frequency components that can be low-frequency ones in the case of slow movements or high-frequency ones in the case of fast movements), the high-pass filters must have a long time constant, for example longer than 100 ms, and a high order. Since the FIR or IIR filters envisage the repetition of one and the same circuit structure a number of times equal to the order of the filter, and the storage of a number of constants once again equal to the order of the filter, these characteristics lead to a considerable circuit complexity and consequently a high use of resources. In particular, in the case of hardware implementation via an ASIC (Application Specific Integrated Circuit) the silicon area occupation and the memory occupation can be excessive beyond a certain order of the filter (mainly in the case of portable applications). Instead, in case of software implementation via a firmware, stored for example in a microcontroller or in a DSP (Digital Signal Processor), it is necessary to choose very costly components and to use all or a large part of the resources of the system just for the filter implementation.

In addition, in numerical filters of a conventional type it is not easy to vary the cutoff frequency, a possibility that is, instead, extremely useful in the described application for the detection of displacements of portable apparatuses. In fact, to detect slow movements made by the user, it is preferable to select a cutoff frequency that is sufficiently low, such that the low-frequency components of the corresponding acceleration signals will have an amplitude sufficient to be detected. Instead, it is preferable to select a higher cutoff frequency if the movements of the user are faster so as to cut off the low-frequency components and in any case to accurately detect the signal components linked to the movements made by the user.

BRIEF SUMMARY

The aim of the present invention is consequently to provide a digital high-pass filter that will enable the problems and the disadvantages referred to above to be overcome, and in particular will have high time constants, will be readily configurable, and at the same time will lead to a reduced use of resources.

According to the present invention, a digital high-pass filter is provided, as defined in claim 1.

According to the present invention a displacement detection device is moreover provided, as defined in claim 10.

BRIEF DESCRIPTION OF THE SEVERAL VIEWS OF THE DRAWINGS

For a better understanding of the present invention, preferred embodiments thereof are now described, purely by way of non-limiting examples and with reference to the attached drawings, wherein.

DETAILED DESCRIPTION

Figure 1:
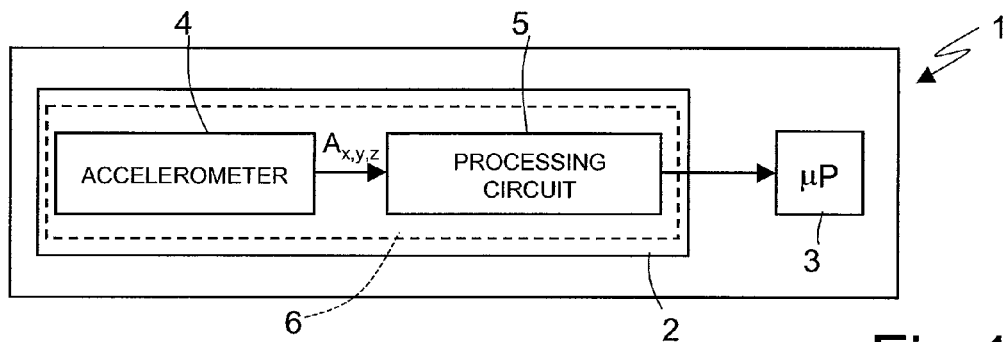
FIG. 1 shows a block diagram of a portable apparatus incorporating a displacement detection device according to one embodiment of the present invention.

FIG. 1 is a schematic illustration of a portable apparatus 1 equipped with a displacement detection device 2 and a microprocessor 3, connected to the displacement detection device 2 and configured to control the general operation of the portable apparatus 1. The displacement detection device 2 comprises an accelerometer 4 of a linear type, and a processing circuit 5, connected to the accelerometer 4. In particular, the processing circuit 5 is made in an ASIC and is integrated together with the accelerometer 4 within a single chip 6 of semiconductor material, preferably silicon.

The accelerometer 4 is of a known type, in particular is constituted by a MEMS (Micro-Electro-Mechanical System) device made using semiconductor technology, has three detection axes x, y and z, and generates three acceleration signals $A_x$, $A_y$, $A_z$ (see also FIG. 2), each correlated to the acceleration detected along a respective detection axis. For example, the accelerometer 4 can be made as described in "3-axis Digital Output Accelerometer for Future Automotive Applications", B. Vigna et al., AMAA 2004.

In brief, the processing circuit 5 receives at input the acceleration signals $A_x$, $A_y$, $A_z$, carries out appropriate processing operations, and supplies at output logic signals corresponding to the displacements of the portable apparatus from a reference position. The microprocessor 3 receives said logic signals and reconstructs therefrom the displacement direction of the portable apparatus 1 so as to activate corresponding functions or programs in the portable apparatus 1.

Figure 2:
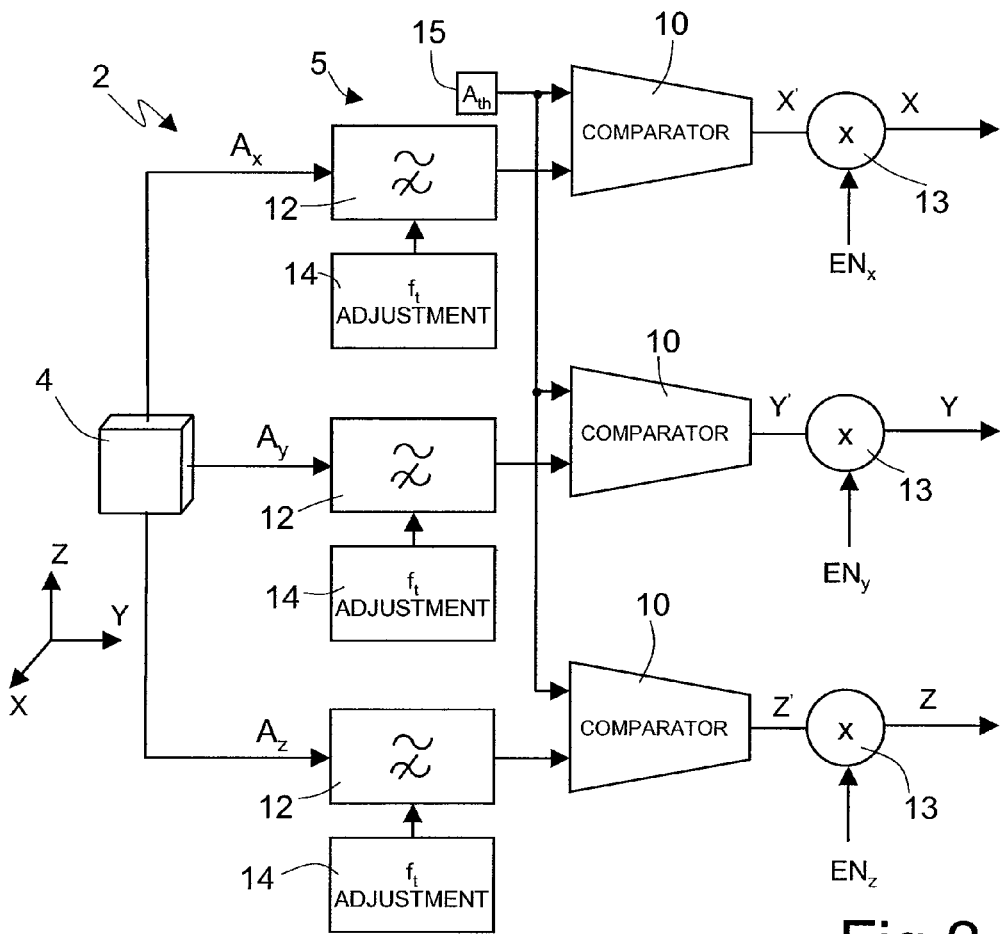
FIG. 2 shows a circuit block diagram of a processing circuit of the displacement detection device of FIG. 1.

In detail, FIG. 2, the processing circuit 5 comprises, for each of the acceleration signals $A_x$, $A_y$, $A_z$, a threshold comparator 10, a digital high-pass filter 12 (which will be described in detail hereinafter) receiving at input a respective acceleration signal $A_x$, $A_y$, $A_z$ from the accelerometer 4, an enabling stage 13, and an adjustment stage 14. The processing circuit 5 further comprises a first register 15, which stores an acceleration threshold $A_{th}$, which can be set from outside by a user.

The threshold comparator 10 has a first input connected to the first register 15, a second input connected to the output of the digital high-pass filter 12, and an output connected to the enabling stage 13. The enabling stage 13, preferably made with logic gates, has a first input connected to the output of the threshold comparator 10, a second input receiving an enabling signal $EN_x$, $EN_y$, $EN_z$ of a logic type, and an output connected to the microprocessor 3 of the portable apparatus 1 (see FIG. 1). In addition, the adjustment stage 14 is connected to the digital high-pass filter 12 for varying its cutoff frequency $f_t$ on the basis of a selection by the user.

The operation of the displacement detection device 2 is the following.

The acceleration signals $A_x$, $A_y$, $A_z$ generated by the accelerometer 4 are filtered in the respective digital high-pass filters 12 and supplied to the respective threshold comparators 10, which first calculate their magnitudes, and then compare them with the acceleration threshold $A_{th}$, generating at output a logic signal (designated by X', Y', Z'). The logic signal X', Y', Z' has, for example, a high value, if the magnitude of the respective acceleration signal $A_x$, $A_y$, $A_z$ is greater than the acceleration threshold $A_{th}$ (a situation corresponding to the detection of an acceleration greater than the threshold set along the respective detection axis x, y, z). When the enabling signal $EN_x$, $EN_y$, $EN_z$ assumes a pre-set logic value, for example high, the enabling stage 13 supplies at output a respective displacement detection signal X, Y, Z corresponding to the logic signal X', Y', Z' received from the respective threshold comparator 10. Otherwise, the enabling stage 13 supplies at output a pre-set logic signal, for example low, so disabling displacement detection along the respective axis x, y, z. Said function is useful for disabling one or more of the detection axes and thus simplifying processing by the microprocessor 3 when it is known which will be the displacement direction of the portable apparatus 1. In any case, the displacement detection signals X, Y, Z are sent to the microprocessor 3, which processes them (in a per-se known manner which is not described in detail herein) to determine the displacement direction of the portable apparatus 1.

In particular, the digital high-pass filter 12 eliminates (or in any case reduces) the continuous component of the respective acceleration signal $A_x$, $A_y$, $A_z$ received at input, which is related to the acceleration of gravity, so that the displacement detection is independent of the initial position of the portable apparatus 1. Furthermore, the adjustment stage 14 enables variation of the cutoff frequency $f_t$ of the digital high-pass filter 12, so as to adapt operation of the processing circuit 5 to the type of application/function that it is desired to obtain. For example, if it is desired to detect slow movements by the user, it is preferable to select a cutoff frequency $f_t$ that is sufficiently low so that the low-frequency components of the corresponding acceleration signals will have an amplitude sufficient to be detected. It is, instead, preferable to select a higher cutoff frequency $f_t$ if the movements by the user are faster.

Figure 3:
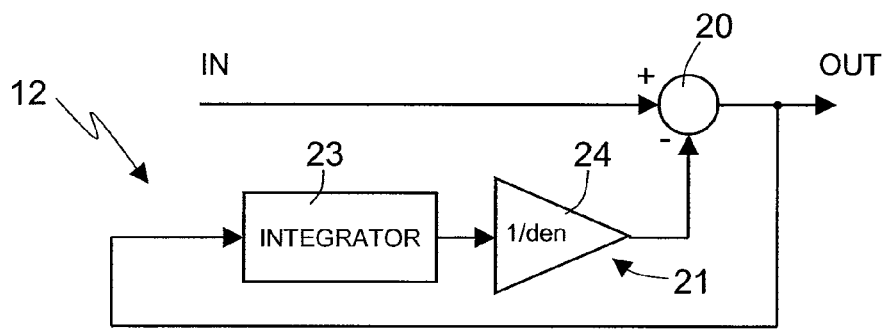
FIG. 3 shows a possible circuit embodiment of a digital high-pass filter in the processing circuit of FIG. 2.

According to an aspect of the present invention, FIG. 3, the digital high-pass filter 12 has a recursive structure and has an input IN connected to the accelerometer 4 and receiving the respective acceleration signal $A_x$, $A_y$, $A_z$, and an output OUT connected to the respective threshold comparator 10. The digital high-pass filter 12 comprises a subtractor stage 20 and a recursive branch 21. The subtractor stage 20 has a positive input terminal connected to the input IN, a negative input terminal connected to the recursive branch 21, and an output terminal connected to the output OUT of the digital high-pass filter 12. The recursive branch 21 connects the output OUT to the negative input terminal of the subtractor stage 20, and comprises an integrator stage 23 and a divider stage 24, cascaded to one another. In particular, the integrator stage 23 is connected at input to the output OUT of the digital high-pass filter 12, and the divider stage 24 has an output connected to the negative input terminal of the subtractor stage 20.

The integrator stage 23 performs an accumulation function in so far as it carries out a summation, possibly weighted (according to the specific circuit configuration), of the samples that it receives at input. The divider stage 24 carries out a division by a dividing factor den, having a value greater than 1.

In detail, when the input IN of the digital high-pass filter 12 is constant at a given value α (for example, on account of a constant acceleration signal due to the sole acceleration of gravity), the recursive branch 21, and in particular the accumulation function of the integrator stage 23, causes the output of the integrator stage 23 to change, in particular to increase, until it assumes a value of α*den. When this condition arises, the negative terminal of the subtractor stage 20 is equal to α, matching the value of the input signal, and the output OUT of the digital high-pass filter 12 goes to zero.

When the input IN varies rapidly (for example, on account of an acceleration signal originated by a movement on the portable apparatus 1), the output OUT of the digital high-pass filter 12 substantially follows the input IN in so far as the recursive branch 21 is not sufficiently fast to follow the variations of the input IN. In this way, the information related to the movement issued by the user to the portable apparatus 1 is brought substantially unaltered to the output OUT of the digital high-pass filter 12. Next, when the input IN reaches again a stable or slowly variable value, the recursive branch 21 brings back to zero the output OUT of the digital high-pass filter 12, with a time that is related to its time constant.

Input signals having low frequencies (for example due to slow movements made by the user of the portable apparatus 1) are instead more or less attenuated, according to whether they are more or less close to the cutoff frequency $f_t$ of the digital high-pass filter 12.

In particular, the cutoff frequency $f_t$ of the digital high-pass filter 12 results from the speed of the recursive branch 21 in annulling the output OUT of the digital high-pass filter 12, i.e., from the speed of the integrator stage 23 in following the variations of the input IN. Said speed is a function of the sampling period of the integrator stage 23, and of the dividing factor den. Given the same sampling period, the higher the dividing factor den, the longer the digital high-pass filter 12 takes to reach a steady state (output OUT zero); i.e., the greater is its time constant. The cutoff frequency $f_t$ of the digital high-pass filter 12 can hence be modified in a simple and fast way by the adjustment stage 14, by simply varying the dividing factor den of the divider stage 24.

Figure 4:
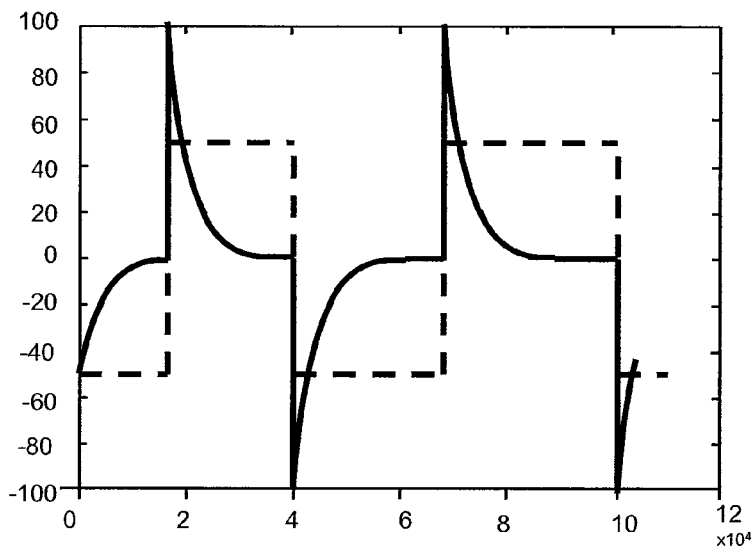
FIG. 4 shows the time response of the digital high-pass filter in the presence of a square-wave input signal.

FIG. 4 illustrates the waveform of the signal at the output OUT of the digital high-pass filter 12 (represented with a solid line) in the presence of a square-wave signal (represented with a dashed line) at the input IN, simulating impulsive application of positive and negative displacements to the portable apparatus 1 by the user. The ordinate gives a normalized numerical value, whilst the abscissa gives the generated number of samples, normalized with respect to the sampling frequency. As may be noted, the output OUT of the digital high-pass filter 12 follows the impulsive variations of the input IN, and goes to zero, in a time related to its time constant, when the signal at the input IN is stable.

Two possible embodiments of the integrator stage 23 are now described.

Figure 5:
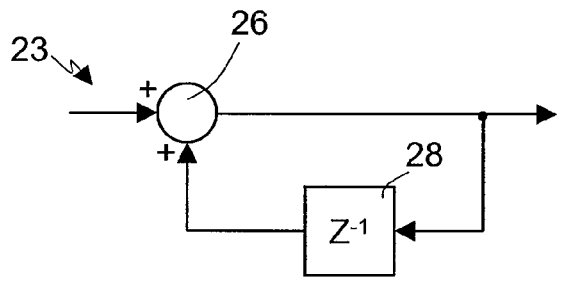
FIG. 5 shows a possible circuit embodiment of an integrator block of the digital high-pass filter of FIG. 3.

In detail, according to a first embodiment, shown in FIG. 5, the integrator stage 23 comprises an adder block 26, and a delay block 28. The adder block 26 has a first positive input terminal connected to the output OUT of the digital high-pass filter 12, a second positive input terminal connected to the output of the delay block 28, and an output terminal connected to the divider stage 24. The delay block 28 has an input connected to the output terminal of the adder block 26, and an output connected to the second positive input of the adder block 26.

With simple mathematical steps, it is found that the Z-transform, designated by H(z), of the digital high-pass filter 12 transfer function is the following:

$$H(z) = \frac{1 - z^{-1}}{\left(1 + \frac{1}{den}\right) - z^{-1}}$$

which has a zero for z=1 and a pole for z=1/(1+1/den).

Figure 6:
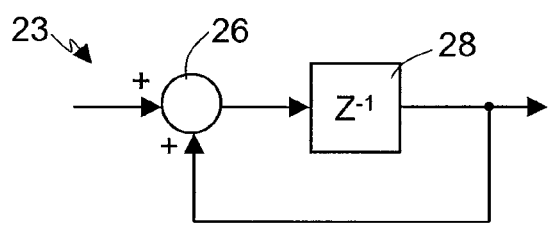
FIG. 6 shows an alternative circuit embodiment of the integrator block of the digital high-pass filter of FIG. 3.

In a second embodiment of the present invention, shown in FIG. 6, the integrator stage 23 has a different circuit configuration. In particular, the delay block 28 is connected at input to the output terminal of the adder block 26 and at output to the divider stage 24. The adder block 26 has, instead, a first positive input terminal connected to the output OUT of the digital high-pass filter 12, a second positive input terminal connected to the divider stage 24, and an output terminal connected to the input of the delay block 28.

In a similar way, also in this case it is possible to obtain with simple mathematical steps the Z-transform of the digital high-pass filter 12 transfer function:

$$H(z) = \frac{1 - z^{-1}}{1 + \left(\frac{1}{den} - 1\right) \cdot z^{-1}}$$

which has a zero for z=1 and a pole for z=1/(1−1/den).

In particular, it should be noted how both of the embodiments of the integrator stage 23 share the common feature of comprising a recursive accumulation structure.

Figure 7A:
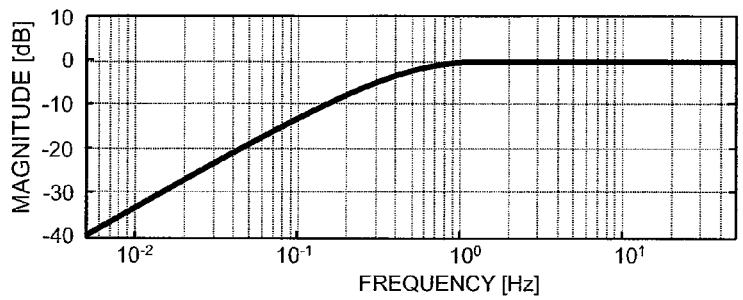
FIGS. 7a-7b and 8a-8b show diagrams of the magnitude and phase response of the digital high-pass filter, for two different values of a variable dividing factor.
Figure 7B:
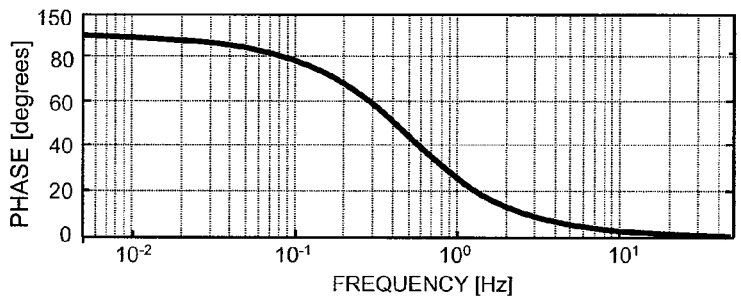
Figure 8A:
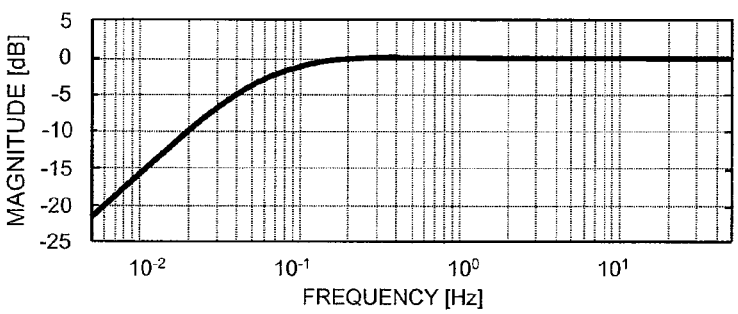
Figure 8B:
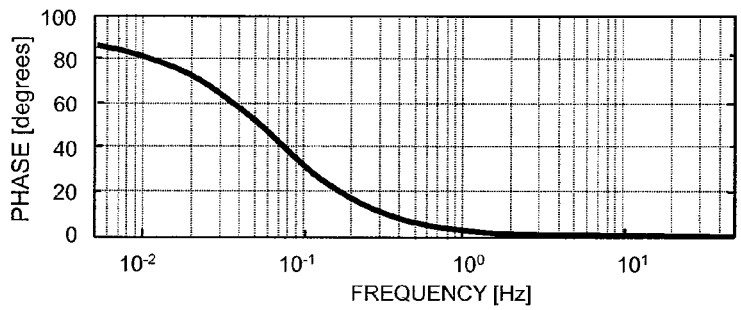

As regards the second embodiment, FIGS. 7a and 7b show the magnitude and phase response against frequency, respectively, of the digital high-pass filter 12 for a first value of the dividing factor den, equal to 32. Likewise, FIGS. 8a and 8b show the magnitude and phase response, respectively, of the digital high-pass filter 12 for a second value of the dividing factor den, equal to 256. In particular, the cutoff frequency $f_t$ of the digital high-pass filter 12 moves towards lower frequencies as the dividing factor den increases.

The advantages of the digital high-pass filter are clear from the foregoing description.

It is, however, emphasized that the structure of the digital high-pass filter is extremely simple, is readily configurable, and calls for a minimum use of resources. In particular, it is sufficient to vary the dividing factor den of the divider stage 24 in order to vary the cutoff frequency $f_t$. In addition, if the values of the dividing factor den are chosen as powers of two, the operation of the divider stage 24 reduces to a simple shift of a digital word, thus further simplifying operation of the digital high-pass filter 12.

Furthermore, the overall displacement detection device can be integrated in a single chip, with obvious advantages in terms of area occupation.

Finally, it is clear that modifications and variations may be made to what has been described and illustrated herein, without thereby departing from the scope of the present invention, as defined in the attached claims.

Figure 9:
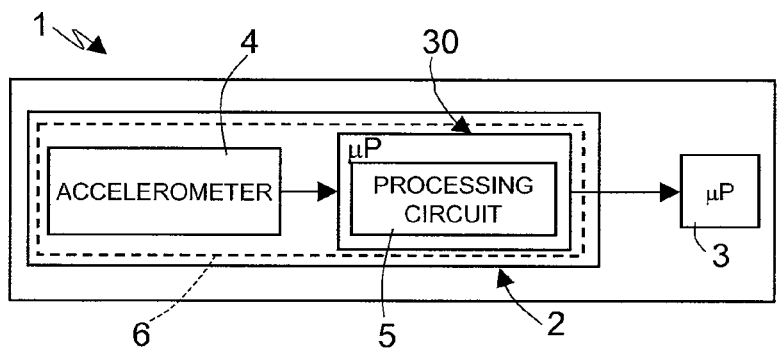
FIG. 9 shows a block diagram of a portable apparatus incorporating a displacement detection device, according to a further embodiment of the present invention.

In particular, in the embodiment of FIG. 9, the processing circuit 5 is obtained entirely via software. In this case, the displacement detection device 2 comprises a microprocessor circuit 30 (for example, a microcontroller or a DSP), on which a firmware is stored that provides the processing circuit 5. In particular, the digital high-pass filter 12 of the processing circuit 5 can be made via software with three simple blocks, namely, an adder block, a subtractor block, and a divider block. Also in this case, the displacement detection device 2 can advantageously be integrated within a single chip 6.

The microprocessor circuit 30 can be equipped with appropriate logic circuits designed to deduce the displacement direction of the portable apparatus 1 and to transmit said information directly to the main microprocessor 3 of the portable apparatus 1 so as to further simplify the management software of the portable apparatus 1.

In addition, the order of cascaded connection between the integrator stage 23 and the divider stage 24 within the recursive branch 21 can be reversed. In this case, the input of the divider stage 24 is connected to the output OUT of the digital high-pass filter 12, and the integrator stage 23 has an output connected to the negative input terminal of the subtractor block 20.

In addition, it is evident to the person skilled in the art that the integrator stage 23 can be made with other circuit configurations with the characteristic recursive accumulation structure.

Furthermore, in addition to being used for simplifying the man-machine interface, the displacement detection device can be used for re-activating a portable apparatus from a stand-by condition (the so-called wake-up function). In this case, the detection of an acceleration greater than the pre-set threshold causes re-activation of functions of the portable apparatus that had previously been de-activated in order to save energy. Finally, the displacement detection device can also be used in systems for control and compensation of vibrations, for example within electrical household appliances. In this case, in fact, it is not necessary to know the continuous acceleration to which the apparatus is subject, but rather the displacement with respect to a resting position.

The invention claimed is:

1. A digital high-pass filter comprising:
    an input;
    an output;
    a subtractor stage, having a first input terminal and a second input terminal and an output terminal, said first input terminal being connected to said input of said digital high-pass filter and said output terminal being connected to said output of said digital high-pass filter; and
    a recursive circuit branch connected between said output of said digital high-pass filter and said second input terminal of said subtractor stage, wherein said recursive circuit branch comprises an accumulation stage and a divider stage cascaded to one another, wherein
    said accumulation stage comprises an integrator circuit having a recursive accumulation structure having an own input terminal, an own output terminal, an adder block connected to said own input terminal, and a delay block connected to said adder block and to said own output terminal; and
    said adder block has a first positive input, a second positive input, and an output, said first positive input of said adder block being connected to said input terminal of said integrator stage, said output of said adder block being connected to said output terminal of said integrator stage; and said delay block having an input connected to said output terminal of said integrator stage and an output connected to said second positive input of said adder block.

2. The digital high-pass filter according to claim 1 wherein said divider stage performs a division by a variable dividing factor, having a value greater than 1.

3. The digital high-pass filter according to claim 2 wherein said dividing factor is a power of 2.

4. The digital high-pass filter according to claim 1 wherein the subtractor stage and the recursive circuit branch are implemented in hardware using an application specific integrated circuit (ASIC).

5. The digital high-pass filter according to claim 1 wherein the subtractor stage and the recursive circuit branch are implemented via software using firmware stored in a microprocessor.

6. The digital high-pass filter according to claim 1 further comprising an adjuster coupled to the divider stage and structured to adjust a dividing factor of the dividing stage.

7. A displacement detection device, comprising:
    an acceleration sensor configured to generate a first acceleration signal corresponding to a first detection axis; and
    a displacement detection circuit connected to said acceleration sensor and configured to generate a first displacement-detection signal, said displacement detection circuit including a digital, first high-pass filter configured to reduce a continuous component of said first acceleration signal wherein said first high-pass filter includes:
    an input;
    an output;
    a subtractor stage, having a first input terminal and a second input terminal and an output terminal, said first input terminal being connected to said input of said digital high-pass filter and said output terminal being connected to said output of said digital high-pass filter; and
    a recursive circuit branch connected between said output of said digital high-pass filter and said second input terminal of said subtractor stage, wherein said recursive circuit branch comprises an accumulation stage and a divider stage cascaded to one another, wherein said displacement detection circuit comprises a first comparator stage configured to receive said first acceleration signal and an acceleration threshold, and generate said first displacement-detection signal, and wherein said first high-pass filter is disposed between said acceleration sensor and said first comparator stage.

8. The device according to claim 7, wherein said displacement detection circuit further comprises cutoff frequency modifying means connected to said first high-pass filter for adjusting the cutoff frequency of said digital high-pass filter, wherein said cutoff frequency modifying means is also for varying a dividing factor of the divider stage of said first high-pass filter.

9. The device according to claim 7, wherein said displacement detection circuit is implemented as an ASIC and is integrated with said acceleration sensor within a single chip wherein said acceleration sensor is a MEMS sensor.

10. The device according to claim 7, further comprising a microprocessor connected to said acceleration sensor and wherein said displacement detection circuit is made in a firmware stored in said microprocessor, and said microprocessor and said acceleration sensor are integrated in a single chip, wherein said acceleration sensor is a MEMS sensor.

11. The device according to claim 7, wherein said acceleration sensor is a linear accelerometer with three detection axes and is configured to generate a second acceleration signal and a third acceleration signal, said first, second and third acceleration signals being correlated to a component of the acceleration along a respective detection axis; and wherein said displacement detection circuit further comprises:
    a second comparator stage and a third comparator stage, for comparing, respectively, said second acceleration signal and said third acceleration signal with said acceleration threshold and generating a second displacement-detection signal and a third displacement-detection signal; and second and third high-pass filters arranged, respectively, between said acceleration sensor and said second and third comparator stages, and configured to reduce continuous components, respectively, of said second and third acceleration signals.

12. A portable apparatus comprising:

an acceleration sensor for generating an acceleration signal corresponding to a detection axis; and a displacement detection circuit operatively connected to the acceleration sensor and structured to generate a displacement-detection signal corresponding to the acceleration signal, wherein the displacement detection circuit is structured to eliminate a continuous component from the acceleration signal, wherein the displacement detection circuit comprises:

a high-pass filter configured to eliminate the continuous component from the acceleration signal;

an adjustment stage communicatively coupled to the high-pass filter and structured to vary a cutoff frequency associated with the high-pass filter;

a storage element structured to store an acceleration threshold signal; and a comparator coupled to an output of the high-pass filter and to the storage element, and having first and second inputs structured to receive the first acceleration signal without the continuous component and the first acceleration threshold signal, respectively, wherein the comparator is configured to generate the displacement-detection signal based on a comparison of the signals on the first and second inputs.

13. The portable apparatus of claim 12, further comprising:

a microprocessor communicatively coupled to an output of the displacement detection circuit for determining a displacement direction of the portable apparatus.

14. The portable apparatus according to claim 12 wherein the high-pass filter comprises:

a subtractor stage having a first input terminal and a second input terminal and an output terminal, wherein the first input terminal is coupled to an input of the high-pass filter and the output terminal is connected to an output of the high-pass filter;

an accumulation stage;

a divider stage, wherein the accumulation stage and the divider stage are cascaded to form a recursive branch coupled between the output of the high-pass filter and the second input terminal of the subtractor stage.

15. The portable apparatus according to claim 14 wherein the divider stage is structured to perform division using a variable dividing factor that is adjusted via the adjustment stage, wherein the variable dividing factor controls the cutoff frequency of the high-pass filter.

16. A digital high-pass filter comprising:

an input;

an output;

a subtractor stage, having a first input terminal and a second input terminal and an output terminal, said first input terminal being connected to said input of said digital high-pass filter and said output terminal being connected to said output of said digital high-pass filter; and a recursive circuit branch connected between said output of said digital high-pass filter and said second input terminal of said subtractor stage, wherein said recursive circuit branch comprises an accumulation stage and a divider stage cascaded to one another, wherein said accumulation stage comprises an integrator circuit having a recursive accumulation structure having an own input terminal, an own output terminal, an adder block connected to said own input terminal, and a delay block connected to said adder block and to said own output terminal; and said adder block has a first positive input, a second positive input, and an output, said first positive input of said adder block being connected to said input terminal of said integrator stage, said second positive input of said adder block being connected to said output terminal of said integrator stage; and said delay block having an input connected to said output of said adder block and an output connected to said output terminal of said integrator stage.

17. The digital high-pass filter according to claim 16 wherein said divider stage performs a division by a variable dividing factor, having a value greater than 1.

18. The digital high-pass filter according to claim 16, further comprising an adjuster coupled to the divider stage and structured to adjust a dividing factor of the dividing stage.

19. A displacement detection device, comprising:

an acceleration sensor configured to generate a first acceleration signal corresponding to a first detection axis; and a displacement detection circuit connected to said acceleration sensor and generating a first displacement-detection signal, said displacement detection circuit including a digital, first high-pass filter configured to reduce a continuous component of said first acceleration signal wherein said first high-pass filter includes:

an input;

an output;

a subtractor stage, having a first input terminal and a second input terminal and an output terminal, said first input terminal being connected to said input of said digital high-pass filter and said output terminal being connected to said output of said digital high-pass filter; and a recursive circuit branch connected between said output of said digital high-pass filter and said second input terminal of said subtractor stage, wherein said recursive circuit branch comprises an accumulation stage and a divider stage cascaded to one another, wherein said displacement detection circuit is implemented as an ASIC and is integrated with said acceleration sensor within a single chip wherein said acceleration sensor is a MEMS sensor.

20. The device according to claim 19, wherein said displacement detection circuit further comprises cutoff frequency modifying means connected to said first high-pass filter for adjusting the cutoff frequency of said digital high-pass filter, wherein said cutoff frequency modifying means is also for varying a dividing factor of the divider stage of said first high-pass filter.

21. A displacement detection device, comprising:

an acceleration sensor configured to generate a first acceleration signal corresponding to a first detection axis; and a displacement detection circuit connected to said acceleration sensor and configured to generate a first displacement-detection signal, said displacement detection circuit including a digital, first high-pass filter configured to reduce a continuous component of said first acceleration signal wherein said first high-pass filter includes:

an input;

an output;

a subtractor stage, having a first input terminal and a second input terminal and an output terminal, said first input terminal being connected to said input of said digital high-pass filter and said output terminal being connected to said output of said digital high-pass filter; and a recursive circuit branch connected between said output of said digital high-pass filter and said second input terminal of said subtractor stage, wherein said recursive circuit branch comprises an accumulation stage and a divider stage cascaded to one another; and a microprocessor connected to said acceleration sensor and wherein said displacement detection circuit is made in a firmware stored in said microprocessor, and said microprocessor and said acceleration sensor are integrated in a single chip, wherein said acceleration sensor is a MEMS sensor.

22. The device according to claim 21, wherein said displacement detection circuit further comprises cutoff frequency modifying means connected to said first high-pass filter for adjusting the cutoff frequency of said digital high-pass filter, wherein said cutoff frequency modifying means is also for varying a dividing factor of the divider stage of said first high-pass filter.

23. A displacement detection device, comprising:

an acceleration sensor configured to generate a first acceleration signal corresponding to a first detection axis; and a displacement detection circuit connected to said acceleration sensor and configured to generate a first displacement-detection signal, said displacement detection circuit including:

a digital, first high-pass filter configured to reduce a continuous component of said first acceleration signal, wherein said first high-pass filter includes:
an input;
an output;
a subtractor stage, having a first input terminal and a second input terminal and an output terminal, said first input terminal being connected to said input of said digital high-pass filter and said output terminal being connected to said output of said digital high-pass filter; and a recursive circuit branch connected between said output of said digital high-pass filter and said second input terminal of said subtractor stage, wherein said recursive circuit branch comprises an accumulation stage and a divider stage cascaded to one another, wherein said acceleration sensor is a linear accelerometer with three detection axes and is configured to generate a second acceleration signal and a third acceleration signal, said first, second and third acceleration signals being correlated to a component of the acceleration along a respective detection axis;

a first comparator stage configured to compare said first acceleration signal with said first acceleration threshold and generate the first displacement-detection signal;

a second comparator stage configured to compare said second acceleration signal with said first acceleration threshold and generate a second displacement-detection signal;

a third comparator stage configured to compare said third acceleration signal with said first acceleration threshold and generates a third displacement-detection signal; and second and third high-pass filters arranged, respectively, between said acceleration sensor and said second and third comparator stages, and configured to reduce continuous components, respectively, of said second and third acceleration signals.

24. The device according to claim 23, wherein said displacement detection circuit is implemented as an ASIC and is integrated with said acceleration sensor within a single chip wherein said acceleration sensor is a MEMS sensor.

25. The device according to claim 23, further comprising a microprocessor connected to said acceleration sensor and wherein said displacement detection circuit is made in a firmware stored in said microprocessor, and said microprocessor and said acceleration sensor are integrated in a single chip, wherein said acceleration sensor is a MEMS sensor.

* * * * *